United States Patent [19]

Garcia et al.

[11] Patent Number: 4,843,448
[45] Date of Patent: Jun. 27, 1989

[54] THIN-FILM INTEGRATED INJECTION LOGIC

[75] Inventors: Graham A. Garcia; Ronald E. Reedy, both of San Diego, Calif.

[73] Assignee: The United States of America as represented by the Secretary of the Navy, Washington, D.C.

[21] Appl. No.: 183,965

[22] Filed: Apr. 18, 1988

[51] Int. Cl.[4] .................................... H01L 29/72
[52] U.S. Cl. ................................ 357/36; 357/34; 357/35; 357/92; 357/46
[58] Field of Search .............. 357/35, 34, 46, 92, 357/15, 36, 43

[56] References Cited

U.S. PATENT DOCUMENTS

| | | | |
|---|---|---|---|
| 3,564,443 | 2/1971 | Nagata | 330/38 |
| 3,898,483 | 8/1975 | Sander et al. | 357/92 X |
| 4,076,556 | 2/1978 | Agraz-Guerena et al. | 357/92 X |
| 4,081,822 | 3/1978 | Dao et al. | 357/44 |
| 4,149,906 | 4/1979 | De La Moneda | 357/92 X |
| 4,220,961 | 9/1980 | Werner | 357/92 X |
| 4,246,500 | 1/1981 | Okada et al. | 307/299 |
| 4,450,468 | 5/1984 | Nishizawa et al. | 357/51 |
| 4,458,261 | 7/1984 | Omura | 357/35 X |
| 4,459,606 | 7/1984 | Tokumaru et al. | 357/44 |

FOREIGN PATENT DOCUMENTS 2841755  4/1979  Fed. Rep. of Germany ... 357/35 X

OTHER PUBLICATIONS

Broom, "Lateral Bipolar Transistor Having a Negative Resistance Characteristic", *IBM Technical Disclosure Bulletin*, vol. 14, No. 4, Sep. 1971, pp. 1343-1344.
Zeidenbergs, "Lateral PNP Transistor with Schottky Barrier Collector", *IBM Technical Disclosure Bulletin*, vol. 14, No. 11, Apr. 72, 3248.

*Primary Examiner*—Andrew J. James
*Assistant Examiner*—William A. Mintel
*Attorney, Agent, or Firm*—Harvey Fendelman; Thomas Glenn Keough

[57] ABSTRACT

An integrated injection logic device formed on an insulating substrate. A lateral, load transistor and an adjacent, vertical switching transistor are formed in the semiconductor layer such that the collector region of the lateral transistor coincides with the base region of the switching transistor. The emitter of the switching transistor is located at the surface of the semiconductor injecting carriers downward into the collector. Isolated multiple collector contacts required for wired-AND logic are obtained by using separate Schottky-barrier contacts for each collector output.

24 Claims, 8 Drawing Sheets

FIG. 5T ance of a large base-emitter junction area in IIL devices and the problems associated with the collector up orientation of prior art IIL devices. The present invention overcomes these problems by forming an IIL semiconductor device in a semiconductor film that is deposited on an insulating substrate. The dielectric isolation provided by the insulating substrate allows the switching transistor to be oriented with the emitter at the semiconductor surface injecting carriers downward to the collector. With this geometry the critical emitter-base junction of the IIL switching transistor may be independently tailored for high speed performance by reducing the active junction area and optimizing the emitter doping. The presence of the insulating substrate permits these device performance improvements without sacrificing the high packing density of the integrated injection scheme. In fact, additional area savings are possible with this thin-film implementation because each IIL cell may be fully isolated from other cells. By contrast, IIL cells in bulk semiconductors must be electrically isolated from each other by surrounding each cell with an area consuming PN junction or oxide.

THIN-FILM INTEGRATED INJECTION LOGIC

STATEMENT OF GOVERNMENT INTEREST

The invention described herein may be manufactured and used by or for the Government of the United States for governmental purposes without the payment of any royalties thereon or therefor.

BACKGROUND OF THE INVENTION

The present invention relates generally to the field of semiconductor devices and, more particularly, to the field of semiconductor devices known as integrated injection logic (IIL).

IIL is a bipolar logic family that integrates a vertically operating switching transistor with a laterally operating load transistor in a contiguous region of semiconductor. The IIL semiconductor device is of particular interest due to the fact that its construction is simpler, can be manufactured at higher yield, can be integrated more densely and may have smaller power delay product when compared with a conventional transistor-transistor logic (TTL) device. In the IIL device the load or lateral transistor is usually used as an injector for injecting minority carriers into the base region of the vertical or switching transistor. The input to such an IIL device is controlled while the minority carriers are injected into the base region of the switching transistor to thereby control the collector output of the vertical transistor which comprises the output of the ILL device.

Figure 1:
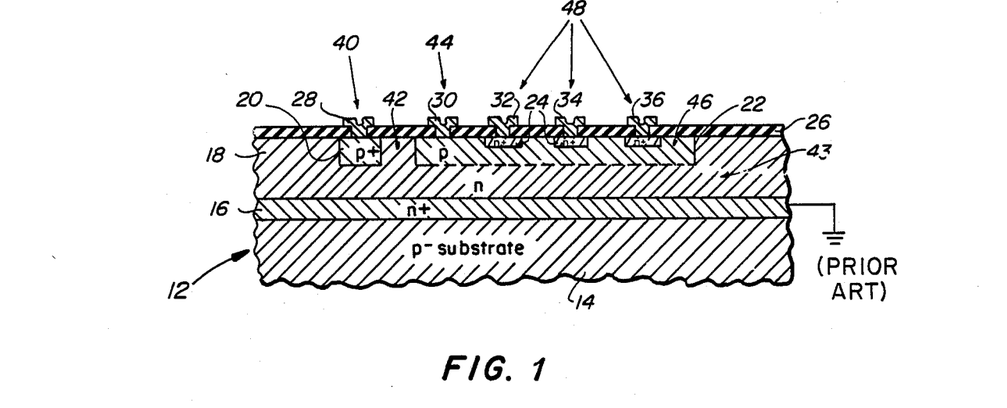
FIG. 1 is a cross-sectional side view of a prior art IIL device geometry.

Referring to FIG. 1 a prior art IIL device is shown in side view. The prior art IIL device 12 is formed on a lightly doped p-type semiconductor substrate 14. A heavily doped layer 16 of n-type semiconductor material is formed over the substrate 14. Then, a semiconductor layer 18 of n-type material is formed over the layer 16 usually by an epitaxial growth process. A heavily doped p-type region 20 is formed by diffusion in the n-type layer 18 as is another region 22 of p-type material. The heavily doped p-type region 20 serves as an injector region for injecting holes. Heavily doped n-type regions 24 are formed in the second p-type region 22. A passivating layer 26, usually of silicon dioxide, is formed over the surface of the layer 18 and, by known processes, windows over the doped regions are opened and filled with metal contacts. Specifically, the metal contact 28 is deposited through the window in passivating layer 26 above the heavily doped p-type region 20. Metal contact 30 is deposited through the window in the area above p-type region 22 and, finally, metal contacts 32, 34 and 36 are deposited in the windows formed above the heavily doped n-type regions 24. Thus, a lateral, load PNP transistor is obtained wherein the emitter 40, base 42 and collector 44 are comprised, respectfully, of the heavily doped p-type region 20, then n-type region 18 and the p-type region 22 as is illustrated. Also, a vertical, switching NPN transistor is formed wherein the emitter 43, base 46 and collectors 48 are comprised, respectfully, of the n-type layer 18, the p-type region 22 and the heavily doped n-type regions 24.

Figure 2:
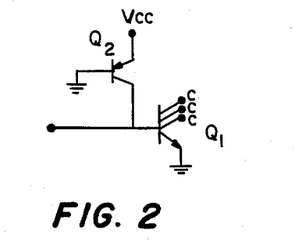
FIG. 2 is a drawing of the equivalent electronic circuit of both the prior art IIL device and of the present invention.

FIG. 2 illustrates the equivalent electronic circuit of the semiconductor device illustrated in FIG. 1 wherein transistor $Q_2$ corresponds to the lateral PNP transistor and wherein the transistor $Q_1$ corresponds to the vertical NPN transistor. As can be seen in FIG. 2, the base region of transistor $Q_2$ and the emitter region of transistor $Q_1$ are at the same potential as is indicated by the ground symbol. This common potential between these regions results from the coincident utilization of n-type layer 18 for the base of transistor $Q_2$ and the emitter of transistor $Q_1$. As can also be seen in FIG. 2, the collector region of transistor $Q_2$ is shared with and coincident with the base region of transistor $Q_1$.

Each integrated cell of IIL devices as illustrated in FIG. 1 is a self-contained logic element which can be interconnected according to wired-AND logic to other ILL cells. The IIL construction technique leads to a considerable reduction in area per logic cell because much of the surface area that is normally required for contacts, interconnections and device isolation can be saved. However, this increase in packing density is offset by a reduction in device performance due to the non-ideal geometry of the switching transistor $Q_1$. The poor performance of $Q_1$ can be attributed to its large base-emitter junction area as is illustrated by the dashed lines in FIG. 1 which is due to the inverted, collector-up orientation of the device combined with the unavoidably large area of the multiple collector. In the prior art structure illustrated in FIG. 1, it is not possible to interchange the emitter and collector regions to obtain the more conventional downward injection because of the electrical connection to the base of the lateral transistor $Q_2$ through the underlying bulk semiconductor substrate 14, 16.

SUMMARY OF THE INVENTION

The present invention solves the problem of the existence of a large base-emitter junction area in IIL devices and the problems associated with the collector up orientation of prior art IIL devices. The present invention overcomes these problems by forming an IIL semiconductor device in a semiconductor film that is deposited on an insulating substrate. The dielectric isolation provided by the insulating substrate allows the switching transistor to be oriented with the emitter at the semiconductor surface injecting carriers downward to the collector. With this geometry the critical emitter-base junction of the IIL switching transistor may be independently tailored for high speed performance by reducing the active junction area and optimizing the emitter doping. The presence of the insulating substrate permits these device performance improvements without sacrificing the high packing density of the integrated injection scheme. In fact, additional area savings are possible with this thin-film implementation because each IIL cell may be fully isolated from other cells. By contrast, IIL cells in bulk semiconductors must be electrically isolated from each other by surrounding each cell with an area consuming PN junction or oxide.

OBJECTS OF THE INVENTION

Accordingly, it is a primary object of the present invention to disclose an IIL device that has the switching transistor oriented with its emitter at the semiconductor surface injecting carriers downward to the collector.

It is a further object of the present invention to disclose an IIL device which takes advantage of the full dielectric isolation afforded by fabrication in a thin semiconductor film on an insulating substrate.

It is a further object of the present invention to disclose an IIL geometry wherein the emitter-base junction of the switching transistor may be independently tailored for high speed performance.

It is a still further object of the present invention to disclose an IIL device that exhibits increased packing density over conventional IIL geometries.

It is an additional object of the present invention to disclose an IIL semiconductor device that obviates the need for a subsurface or edge connection of the emitter of the switching transistor to ground.

These and other objects of the invention will become more readily apparent from the ensuring specification when taken together with the drawings.

DESCRIPTION OF THE PREFERRED EMBODIMENT

Figure 3:
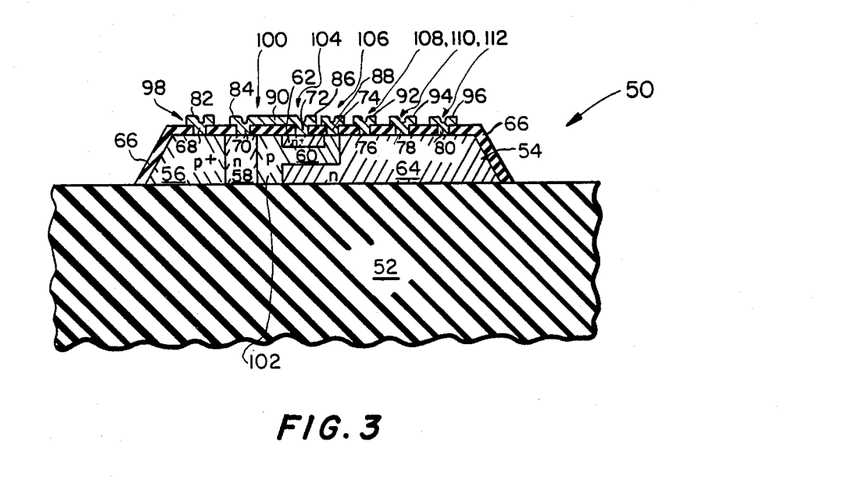
FIG. 3 is a cross-sectional side view of the IIL device of the present invention.
Figure 4:
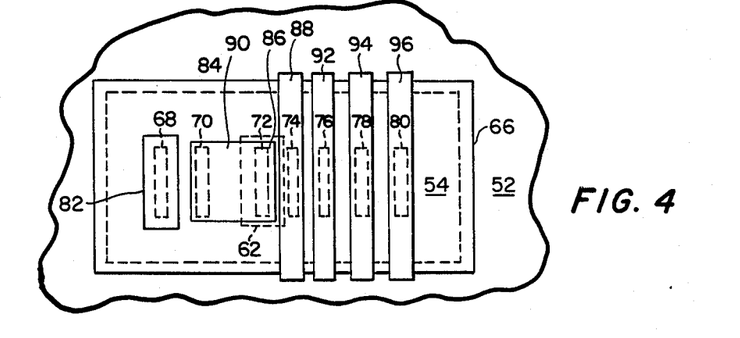
FIG. 4 is a top view of the IIL device of the present invention.

Referring now to FIGS. 3 and 4, the integrated injection logic device of the present invention will be described. The integrated injection logic device 50 may be formed using totally standard deposition, diffusion and photolithographic processes as will be described, by way of example, in subsequent FIGS. 5A–5T inclusive. A key feature of the present invention is that the device 50 is formed on an insulating substrate 52. The insulating substrate 52 may be the insulator that is used in any semiconductor-on-insulator process. For example, the insulating substrate may comprise sapphire or it may comprise the silicon dioxide layer that is formed by a buried oxide implant in an implanted buried oxide process. A thin film of the semiconductor material 54 is deposited upon insulating substrate 52 and may be comprised of any semiconductor material such as silicon, indium phosphide, or gallium arsenide. A first heavily doped region 56 of p-type material is formed in the semiconductor film 54. A second region 58 of n-type material is formed adjacent the region 56 so as to form a first PN junction. A third region 60 of p-type material having a generally inverted chair-shaped cross-sectional configuration is formed adjacent the region 58 to thereby create a second PN junction. A fourth region 62 of heavily doped n-type material is formed within and overlying the region 60. Finally, a fifth region 64 of n-type material is formed adjacent and partially underlying region 60 as illustrated.

A passivating layer 66 is formed over the semiconductor mesa 54 and may preferably be comprised of silicon dioxide. Windows 68, 70, 72, 74, 76, 78 and 80 are provided in the passivating layer 66. Contact metal such as aluminum fills the windows 68, 70 and 72 to form the metal contacts 82, 84, 86 and 88. Metal contacts 84 and 86 are interconnected by metallization 90. Schottky-barrier contacts are formed by suitable metals such as silicide within the windows 76, 78 and 80 to make Schottky contacts 92, 94 and 96, respectively.

It can thus be appreciated that a PNP transistor has been formed by the adjacent regions 56, 58 and 60 and that an NPN transistor has been formed by the adjacent regions 62, 60 and 64. The PNP transistor formed by regions 56, 58 and 60 comprises the lateral or load transistor of the integrated injection logic device and corresponds to the transistor $Q_2$ in FIG. 2. Contact to the emitter 98 of transistor $Q_2$ is made via metal contact 82. Contact to the base 100 is made via contact 84. Region 60 corresponds to the $Q_2$ collector 102. Contact to it is made via metal contact 88.

Contact is made to emitter 104 of transistor $Q_1$ via metal contact 86. Contact is made to base 106 via metal contact 88. Contact to the collectors 108, 110 and 1121 of transistor $Q_1$ are made via the Schottky-barrier contacts 92, 94 and 96.

As is illustrated in FIG. 3, and with reference to FIG. 2, the transistor $Q_2$ base and the transistor $Q_1$ emitter are maintained at the same potential by the metal interconnect 90. It should also be readily appreciated that the collector region of transistor $Q_2$ coincides with the base region of transistor $Q_1$, namely, region 60. Generally, this region is thus shared as in the prior art bulk substrate device illustrated in FIG. 1. In contrast, however, to the bulk integrated injection logic device illustrated in FIG. 1, the thin film-version of the present invention has the emitter of switching transistor $Q_1$ located at the surface of the semiconductor via region 90 and metal contact 86 such that carriers are injected downward into the collector 102. Also, whereas the prior art device requires a subsurface connection in order to maintain the emitter of transistor $Q_1$ at ground potential in common with the base of transistor $Q_2$, the provision for this common ground potential of the base of transistor $Q_2$ and the emitter of transistor $Q_1$ is achieved without a subsurface connection, simply, via metallization region 90.

Isolated multiple collector contacts, required for wired-AND logic are obtained by using the separate Schottky-barrier contacts 92, 94 and 96 for each collector output.

Figure 6:
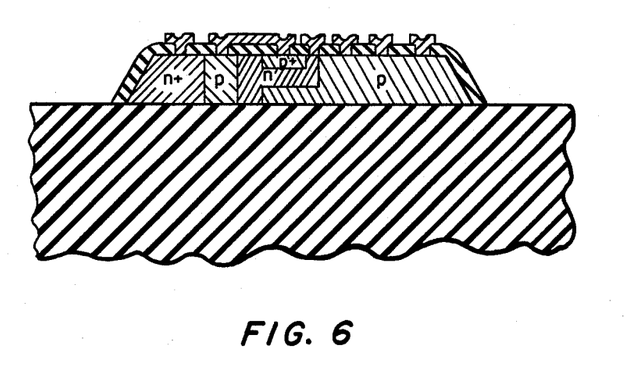
FIG. 6 is a cross-sectional side view of an alternate embodiment of the present invention.
Figure 7:
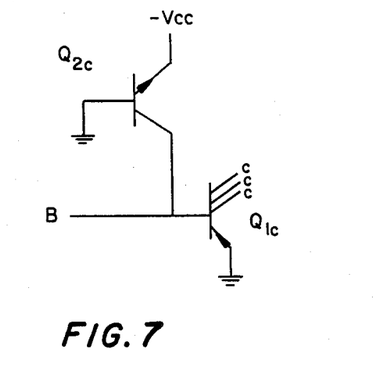
FIG. 7 is an electronic schematic diagram of an equivalent circuit of an alternate embodiment of the present invention shown in FIG. 6.

FIG. 6 illustrates an alternate embodiment of the present invention that constitutes the full complement of the load/switching transistor pair illustrated in FIGS. 2 and 3. Specifically, by utilizing the opposite type semiconductor material from those illustrated in FIG. 3 the full complement is achieved such that the lateral, load transistor is formed as an NPN transistor and the switching transistor is formed as a PNP transistor. The equivalent electronic circuit for the device illustrated in FIG. 6 is shown in FIG. 7.

Figure 5A:
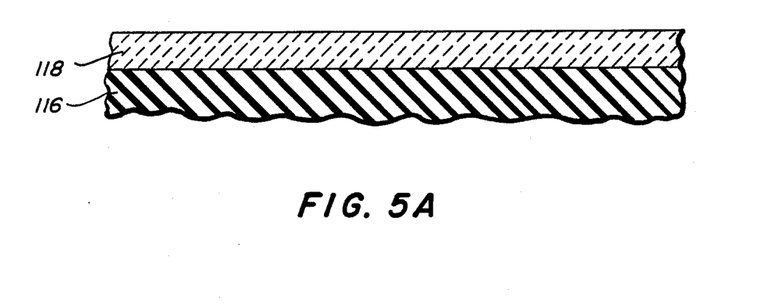
FIGS. 5A, 5B, 5C, 5D, 5E, 5F, 5G, 5H, 5I, 5J, 5K, 5L, 5M, 5N, 5O, 5P, 5Q, 5R, 5S, and 5T are sectional side view showing, by way of example, successive steps of manufacturing the IIL device of the present invention.

By way of example and with reference to FIGS. 5A through 5T inclusive, successive steps of manufacturing one embodiment of the integrated injection logic semiconductor device of the present invention will now be described. As is shown in FIG. 5A the process may begin with an insulator substrate which may, for example, be $Al_2O_3$ (sapphire) or $SiO_2$ (silicon dioxide) substrate 116 upon which has been formed a film 118 of Si (silicon) to a thickness of approximately 0.5 to 1.0 μm. Any silicon-on-insulator (SOI) structure may be utilized as the starting materials for the process disclosed herein.

Figure 5B:
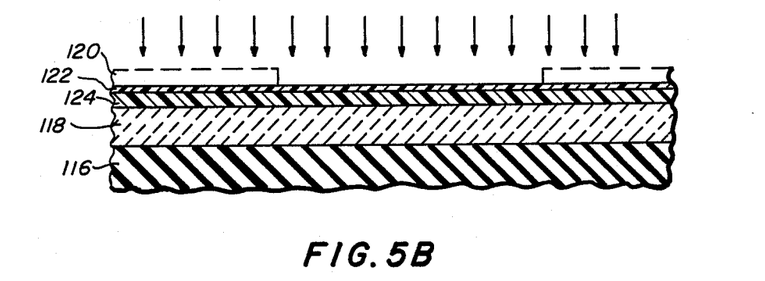

FIG. 5B illustrates the step of forming silicon islands on the SOI structure by shining ultraviolet light, through photomask 120, onto negative photoresist layer 122 which has been formed on a layer of silicon dioxide 124 which has been deposited on top of the silicon film 118.

Figure 5C:
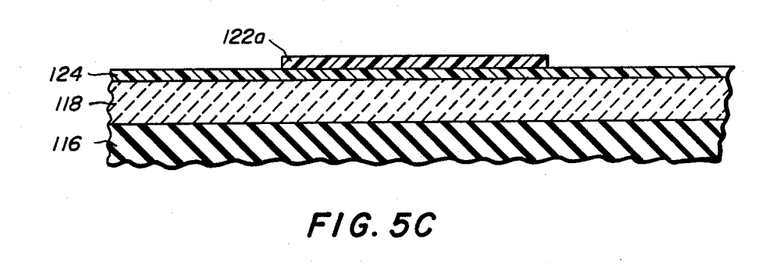

In FIG. 5C the photomask 120 has been removed and the photoresist layer 122 has been chemically washed by a photoresist developer as is well known and the photoresist mesa or island 122a remains over the $SiO_2$ layer 124.

Figure 5D:
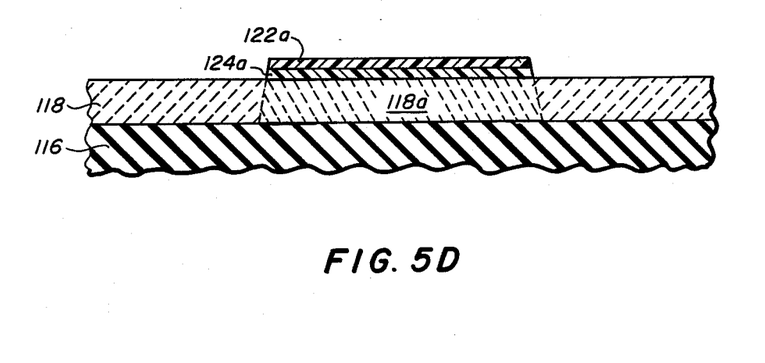

The $SiO_2$ layer 124 is then etched in a suitable etchant such as hydrofluoric acid to remove all of the layer of $SiO_2$ except for the portion 124a beneath the photoresist material 122a as is shown in FIG. 5D.

Figure 5E:
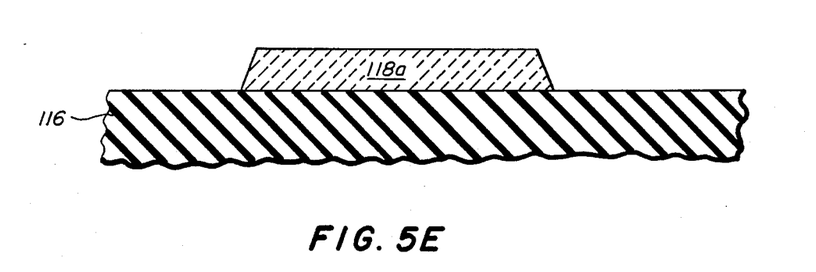

Following the etching away of the $SiO_2$ as described in the previous step, the remaining photoresist 122a and $SiO_2$ 124a and also portions of the silicon layer 118 are stripped away except for the portion 118a of silicon underlying the $SiO_2$ island 124a as is shown in FIG. 5E.

Figure 5F:
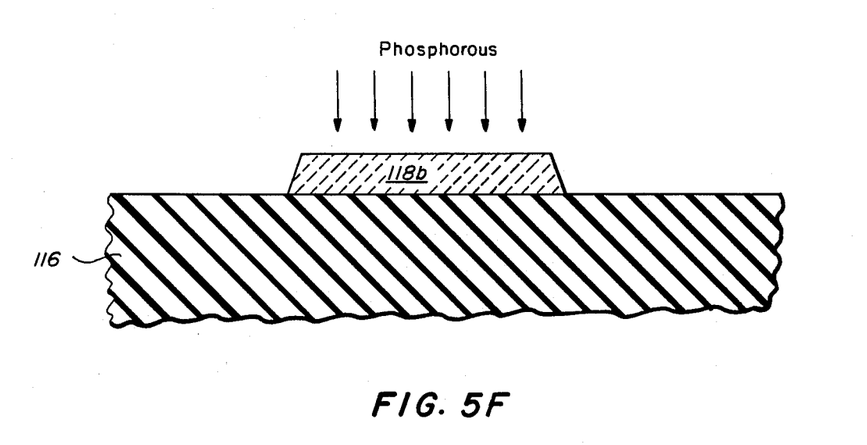
Figure 5G:
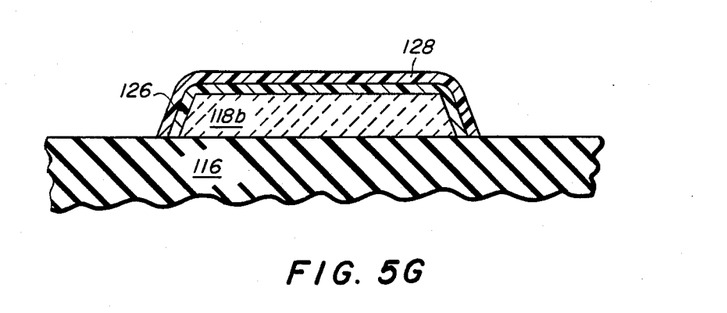

As is illustrated in FIG. 5F the silicon island 118a is next implanted with n-type phosphorous dopant or, for example, As (arsenic) dopant to create an n-type doped silicon island 118b.

Figure 5H:
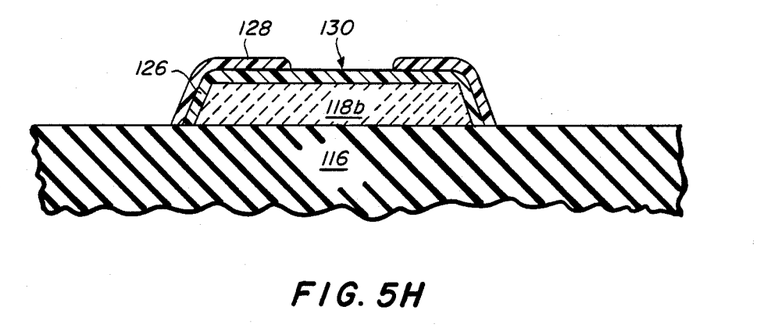
Figure 5I:
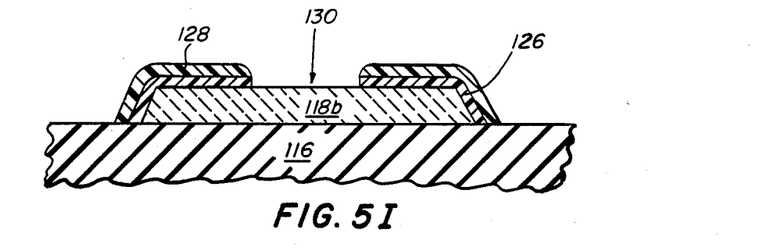

The next step in the process involves the formation of the base region of the $Q_1$ transistor. This is accomplished by forming a film 126 of $SiO_2$ and a film 128 of photoresist over the $SiO_2$ using standard processes similar to those illustrated in FIGS. 5A through 5D above. As is illustrated in FIG. 5H the photoresist layer 128 is exposed through a photomask and is developed to open window 130. An HF (hydrofluoric) acid etchant, for example, is then used to etch away the $SiO_2$ beneath the window 130 down to the surface of the n-type silicon island 118b as is illustrated in FIG. 5I.

Figure 5J:
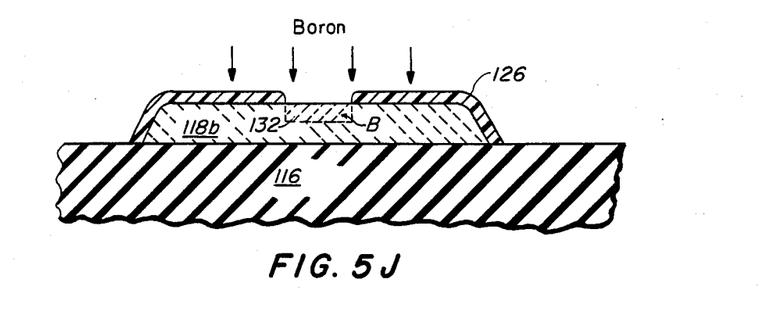
Figure 5K:
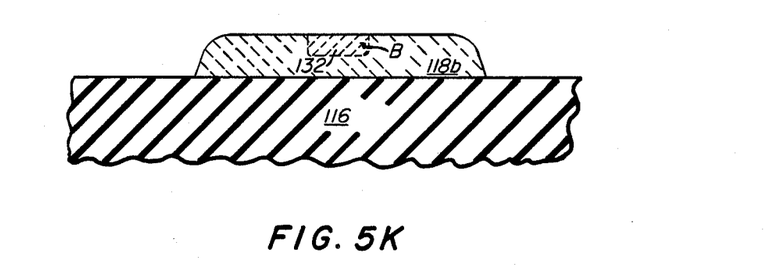

As is shown in FIG. 5J the film 128 of photoresist is then stripped away and the transistor $Q_1$ base region is doped with a p-type dopant such as boron in region 132. The remaining portions of layer 126 of $SiO_2$ are stripped away by using a chemical such as HF acid as is well known to leave p-type region 132 within the n-type silicon layer 118b as is shown in FIG. 5K.

Figures 5L, 5M:
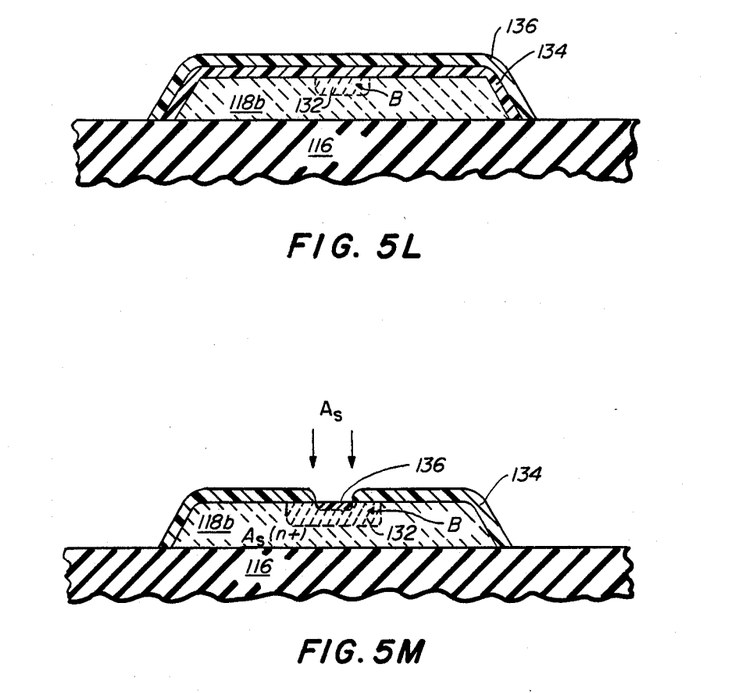

The formation of the emitter region of the $Q_1$ transistor is accmplished by depositing a layer 134 of $SiO_2$ over the island 118b and also forming a photoresist layer 136 over the $SiO_2$ layer as would be readily understood by those of ordinary skill in the art and as is illustrated in FIG. 5L. As is illustrated in FIG. 5M an emitter region 136 is opened inside the base region 132 by standard processes as would be readily understood by those having ordinary skill in the art and is implanted with heavily doped, n+, dopant such as As (arsenic). The remaining portion of the layer 134 of $Si_02$ is then stripped away as by using HF acid as is well known. The base and emitter regions of the $Q_1$ transistor have now been formed.

Figure 5N:
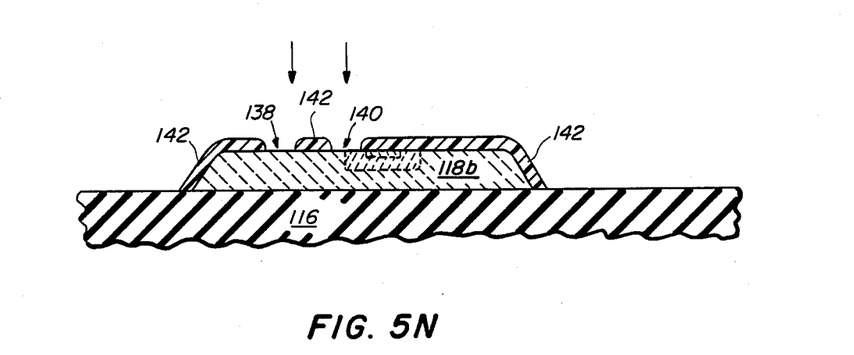
Figure 5O:
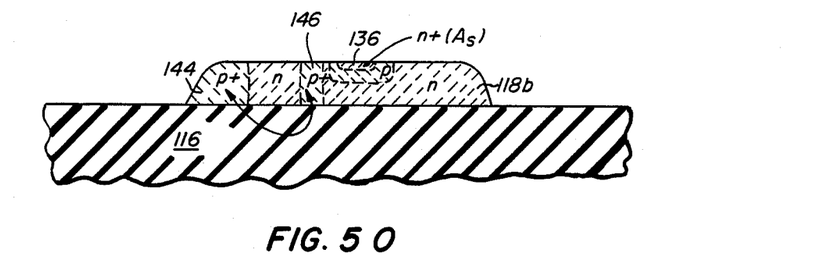
Figure 5P:
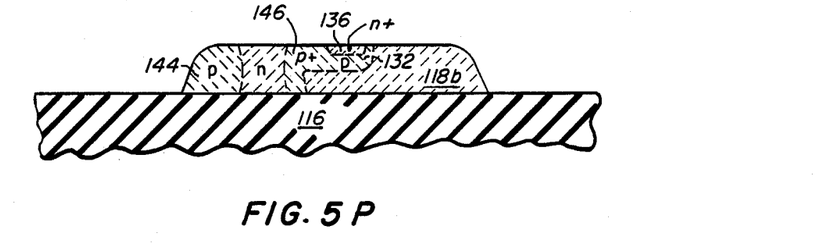

FIG. 5N illustrates the formation of the emitter and the collector regions of the $Q_2$ transistor. Using standard photolithorgraphic processes as previously described, windows 138 and 140 are opened in $SiO_2$ mask layer 142 with window 140 overlying the p-type region 132 of the base junction of the $Q_1$ transistor. Heavily doped p-type material such as B (boron) is implanted through the windows 138 and 140 to create the heavily doped p+ regions 144 and 146 as is illustrated in FIG. 5O. As is illustrated in FIG. 5P, the p+ dopant is activated at a temperature of, for instance, 850° C.

Figure 5Q:
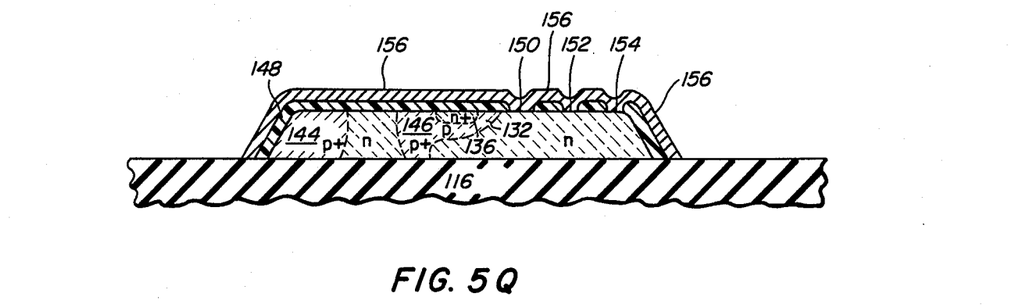
Figure 5R:
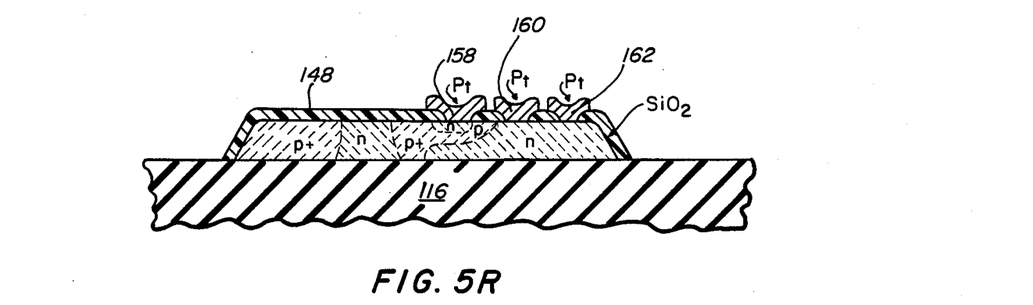

Schottky barrier metallizations are formed in contact with the collector of $Q_1$ as follows. A layer 148 of $SiO_2$ is deposited over the device processes as illustrated in FIG. 5P and contact windows 150, 152 and 154 are formed in the $SiO_2$ layer 148 as is illustrated in FIG. 5Q. This is accomplished using standard photolithographic techniques as would be readily understood by those of ordinary skill in this art. Then, a metallization layer 156 is formed over the $SiO_2$ layer 148 and filling the windows 150, 152 and 154. The metallization layer 156 is preferably p+(platinum). Using photoresist and standard photolithographic techniques the metal layer 156 is etched away from the areas not covered by the resist material, leaving platinum contacts 158, 160 and 162 filling the windows 150, 152 and 154 and in contact with collector region of of transistor $Q_1$. This is illustrated in FIG. 5R.

Figure 5S:
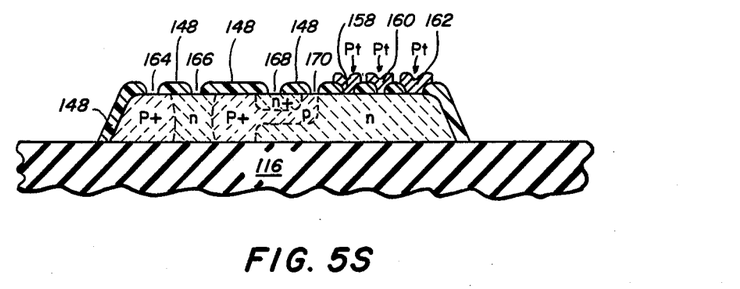
Figure 5T:
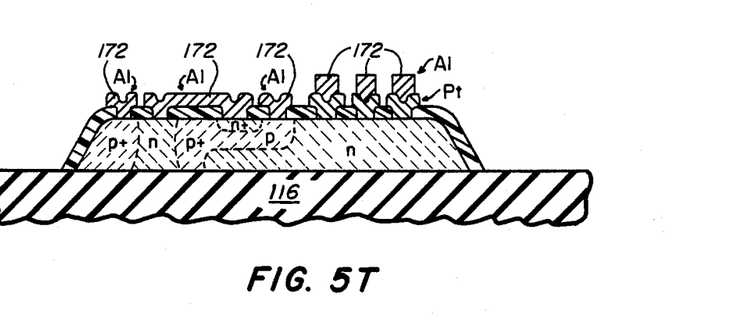

Next, photoresist is applied and contact windows 164, 166, 168 and 170 are formed in the $SiO_2$ layer 148 to accommodate the remaining metal contacts as is illustrated in FIG. 5S.

Finally, a metal layer 172 of a suitable metal such as aluminum is deposted over the $SiO_2$ layer 148 and within the windows 164, 166, 169 and 170 and also over the metal contacts 158, 160 and 162. Using photoresist and standard photolithographic techniques, photoresist is patterned to leave the aluminum contact material 172 within the windows 164, 166, 168 and 170 and also over the contacts 158, 160 and 162 as is illustrated in FIG. 5T thereby forming the $Q_2$ transistor emitter contacts, the transistor $Q_2$ base contact, the transistor $Q_1$ emitter contact, and the transistor $Q_1$ base contacts as are illustrated more fully in FIG. 4 previously described. The aluminum metallization layer is sintered as is well known at, for example, 450° C.

Obviously, many modifications and variations of the present invention are possible in the light of the above teachings. It is therefore to be understood that within the scope of the appended claims the invention may be practiced otherwise than as specifically described.

We claim:

1. An integrated injection logic semiconductor device comprising:
   an insulating substrate;
   a thin film of semiconductor material disposed over said insulating substrate;
   a lateral transistor having a base, an emitter and a collector region formed in said thin film of semiconductor material;
   a vertical transistor having a base, an emitter and a collector region, formed in said thin film of semiconductor material adjacent said load lateral transistor, said base region of said vertical transistor coinciding with said collector region of said lateral transistor.

2. The integrated injection logic semiconductor device of claim 1 wherein:
   said emitter region of said vertical transistor is located at a non-insulated surface of said semiconductor material.

3. the device of claim 2 wherein:
   said vertical transistor is an NPN transistor; and
   said lateral transistor is a PNP transistor.

4. The device of claim 1 wherein:
   said vertical transistor is an NPN transistor, and
   said lateral transistor is a PNP transistor.

5. The device of claim 1 wherein:
   said vertical transistor is a PNP transistor; and said lateral transistor is an NPN transistor.

6. The device of claim 2 wherein:
said vertical transistor is a PNP transistor; and
said lateral transistor is an NPN transistor.

7. The device of claim 1 wherein:
said semiconductor material is silicon.

8. The device of claim 7 wherein:
said insulating substrate is sapphire.

9. The device of claim 7 wherein:
said insulating substrate is silicon dioxide.

10. An integrated injection logic semiconductor device comprising:
an insulating substrate;
a first region of a semiconductor of a first conductivity type position on said insulating substrate;
a second region of said semiconductor of the opposite conductivity type positioned on said insulating substrate in contact with said first region so as to form a first lateral semiconductor junction therewith;
a third region of said semiconductor of said first conductivity type having a portion thereof positioned on said substrate, in contact with said second region so as to form a second lateral semiconductor junction therewith;
a fourth region of said semiconductor of said opposite conductivity type, encompassed by and on top of said third region, so as to form a first vertical semiconductor junction therewith; and
a fifth region of said semiconductor of said opposite conductivity type positioned on said insulating substrate, in contact with and at least partially underlying said third region so as to form a second vertical semiconductor junction therewith.

11. The device of claim 10 further comprising:
a passivating layer covering said semiconductor.

12. The device of claim 11 wherein said passivating layer is silicon dioxide.

13. The device of claim 11 further comprising:
a first metal contact extending through said passivating layer and in contact with said first region;
a second metal contact extending through said passivating layer and in contact with said second and forth regions;
a third metal contact extending through said passivating layer and in contact with said third region; and
at least one metal contact extending through said passivating layer and in contact with said fifth region.

14. The device of claim 13 wherein there are a plurality of metal contacts extending through said passivating layer and in contact with said fifth region.

15. The device of claim 14 wherein:
said plurality of metal conducts are Schottky-barrier contacts.

16. The device of claim 13 wherein:
said at least one metal contact is a Schottky-barrier contact.

17. The device of claim 10 wherein:
said first conductivity type is p-type material and said second conductivity type is n-type material.

18. The device of claim 17 wherein:
said first region is heavily doped p-type material.

19. The device of claim 18 wherein:
said fourth region is heavily doped n-type material.

20. The device of claim 10 wherein:
said first conductivity type is n-type material and said opposite conductivity type is p-type material.

21. The device of claim 20 wherein:
said first region is heavily doped n-type material and said second region is heavily doped p-type material.

22. In an integrated injection logic semiconductor including a lateral transistor and an adjacent vertical transistor formed in a layer of semiconductor material, the improvement wherein:
said layer of semiconductor material is formed directly on the surface of an insulating substrate.

23. The improvement of claim 11 wherein:
said vertical transistor has a base, a collector and an emitter and wherein said emitter is at a non-insulated surface of said semiconductor material.

24. In an integrated injection logic semiconductor including a lateral transistor and an adjacent vertical transistor formed in a layer of semiconductor material, said vertical transistor having a base, a collector and an emitter, the improvement wherein:
said emitter is at a non-insulated surface of said semiconductor material.

* * * * *